United States Patent
Najar et al.

(10) Patent No.: US 10,008,620 B1
(45) Date of Patent: Jun. 26, 2018

(54) METHOD OF MAKING GALLIUM ANTIMONIDE NEAR INFRARED PHOTODETECTOR

(71) Applicant: UNITED ARAB EMIRATES UNIVERSITY, Al-Ain (AE)

(72) Inventors: Adel Najar, Al-Ain (AE); Muhammad Shafa, Al-Ain (AE)

(73) Assignee: UNITED ARAB EMIRATES UNIVERSITY, Al-Ain (AE)

(*) Notice: Subject to any disclaimer, the term of this patent is extended or adjusted under 35 U.S.C. 154(b) by 0 days. days.

(21) Appl. No.: 15/461,441

(22) Filed: Mar. 16, 2017

(51) Int. Cl.
*H01L 31/0304* (2006.01)
*H01L 31/09* (2006.01)
*H01L 31/18* (2006.01)
*H01L 31/0296* (2006.01)

(52) U.S. Cl.
CPC ...... *H01L 31/0296* (2013.01); *H01L 31/0304* (2013.01); *H01L 31/09* (2013.01); *H01L 31/1836* (2013.01)

(58) Field of Classification Search
CPC .. H01L 31/0296; H01L 31/09; H01L 31/1836
USPC ............................................ 438/57; 257/431
See application file for complete search history.

(56) References Cited

U.S. PATENT DOCUMENTS 3,591,340 A * 7/1971 Plaskett ................. C30B 11/12
117/77
5,865,906 A 2/1999 Ferguson et al.
2011/0260059 A1 * 10/2011 Jiang ................... H01L 27/1461
250/330
2014/0312304 A1 10/2014 Miura et al.
2016/0192480 A1 * 6/2016 Choi ............... H01L 31/022466
428/337

FOREIGN PATENT DOCUMENTS

CN 101576413 A 11/2009
JP 2012256826 A 12/2012

OTHER PUBLICATIONS

Shafa et al, "Mid-infrared photodetectors based on InSb micro/nanostructures grown on low-cost mica substrate", Materials Letters 169 (2016) 77-81 (av to public Jan. 20, 2016).*
Ryall, Patrick Randall. Thin films of Gallium Antimonide by flash evaporation. Diss. University of British Columbia, 2011.
Wang, Xudong, Physical Vapor Deposition Technique for Growing Nanostructures, www.nanoscience.gatech.edu/zlwang/research/pvd.html, 1 sheet, printed Feb. 21, 2017.

* cited by examiner

Primary Examiner — Johannes P Mondt
(74) Attorney, Agent, or Firm — Richard C. Litman

(57) ABSTRACT

The method of making a gallium antimonide near infrared photodetector is a physical vapor deposition-based method of forming a thin film of gallium antimonide (GaSb) on a mica substrate for use as a photodetector for light in the near infrared range. Following physical vapor deposition (PVD) of the thin film of GaSb on the mica substrate, a pair of spaced apart electrodes is attached to the thin film of GaSb, thus forming the gallium antimonide near infrared photodetector.

11 Claims, 13 Drawing Sheets

METHOD OF MAKING GALLIUM ANTIMONIDE NEAR INFRARED PHOTODETECTOR

BACKGROUND OF THE INVENTION

1. Field of the Invention

The present invention relates to semiconductor materials and devices, and particularly to a method of making a gallium antimonide (Ga—Sb) near infrared photodetector using physical vapor deposition.

2. Description of the Related Art

Gallium antimonide (GaSb) is of great interest in electronics and optoelectronics. GaSb thin films respond to a near infrared region of 2-5 µm, which corresponds to a direct band gap of 0.72 eV. Due to this significant property of GaSb films, GaSb is used as a semiconductor material in the fabrication of photonic devices, such as photodetectors, laser diodes, thermophotovoltaic cells and optical communication devices. Although GaSb film-based devices are presently being manufactured, the resultant devices are typically very expensive and have issues related to durability. Thus, a method of making a gallium antimonide near infrared photodetector solving the aforementioned problems is desired.

SUMMARY OF THE INVENTION

The method of making a gallium antimonide near infrared photodetector is a physical vapor deposition-based method of forming a thin film of gallium antimonide (GaSb) on a mica substrate for use as a photodetector for light in the near infrared region. Following physical vapor deposition (PVD) of the thin film of GaSb on the mica substrate, a pair of electrodes are formed on the thin film of GaSb such that the thin film of GaSb is sandwiched between the mica substrate and the pair of electrodes, thus forming the gallium antimonide near infrared photodetector.

The physical vapor deposition (PVD) is performed by placing a quantity of gallium ingot and a quantity of antimony shot in a quartz boat in a central zone of an aluminum tube furnace, which is heated to about 850° C. for 180 minutes to form gallium antimonide vapor under flow of an inert gas. The mica substrate is positioned downstream of the quartz boat in an area of the oven having a temperature gradient between 200° C.–500° C., so that a thin film of the gallium antimonide vapor is deposited on the surface of the mica substrate. Spaced apart electrodes are attached to the GaSb thin film on the surface of the mica using a conductive graphite paste to form the photodetector.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
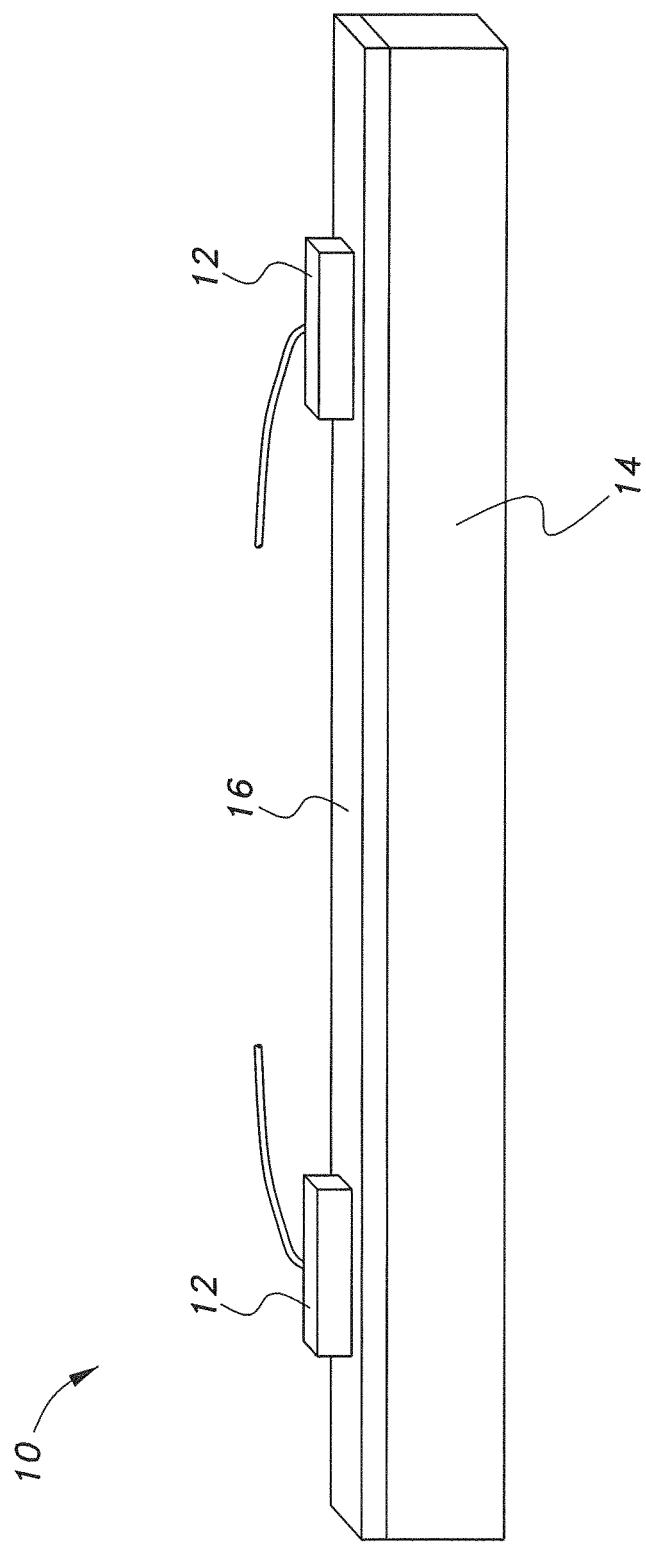
FIG. 1 is a schematic diagram of a photodetector made using the method of making a gallium antimonide near infrared photodetector according to the present invention.

The method of making a gallium antimonide near infrared photodetector is a physical vapor deposition-based method of forming a thin film of gallium antimonide (GaSb) on a mica substrate for use as a photodetector for light in the near infrared range. FIG. 1 is a schematic diagram of an exemplary photodetector 10 made by the present method, including mica substrate 14 with a thin film of GaSb 16 formed thereon. Following physical vapor deposition (PVD) of the thin film of GaSb 16 on the mica substrate 14, a pair of spaced apart electrodes 12 are attached to the GaSb thin film 16 on the surface of the mica 14 using a conductive graphite paste, thus forming the GaSb-based near infrared photodetector 10.

Figure 2:
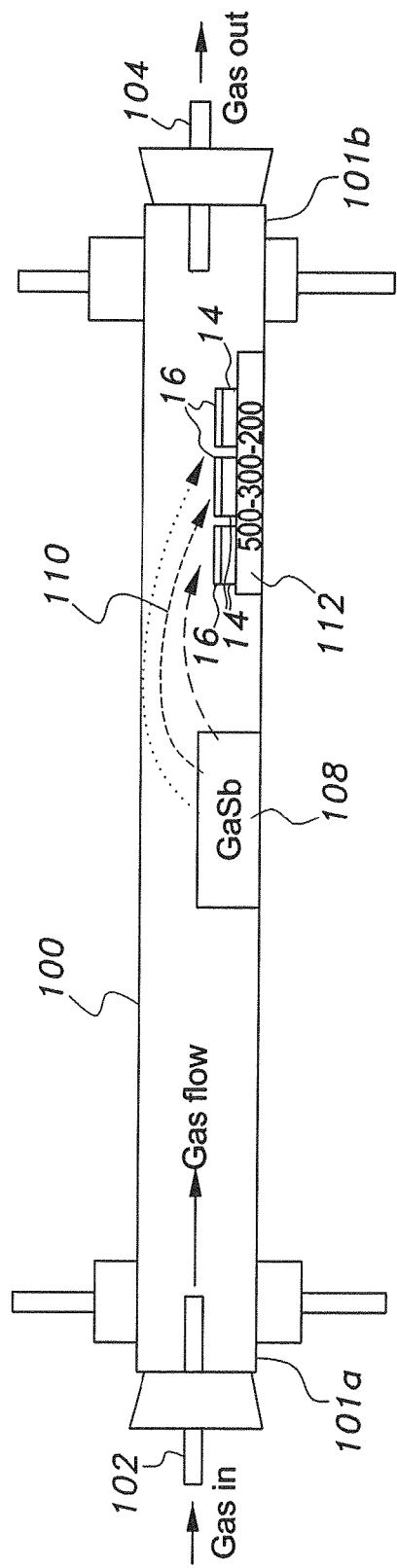
FIG. 2 is a schematic diagram of an exemplary physical vapor deposition apparatus used in testing the method of making a gallium antimonide near infrared photodetector according to the present invention.

As illustrated in FIG. 2, the physical vapor deposition is performed by positioning a quantity of gallium ingot and a quantity of antimony shot in a quartz boat in a central zone (which is the hottest portion of the furnace) of an aluminum tube furnace 100, which is heated to about 850° C. for 180 minutes under pressure to form gallium antimonide 108, which forms a vapor under flow of an inert gas. Three mica substrates 14 are shown downstream mounted on a support 112 in an area of the oven 100 having a temperature gradient between 200° C.-500° C. (the temperature can be measured precisely, in this case, at 500° C., 300° C., and 200° C., so that a thin film of the gallium antimonide vapor is deposited on the surface of the mica substrate. The three samples produced at the three different temperatures were examined, as will be described in detail below, to determine an optimal temperature in the deposition zone.

The aluminum tube furnace 100 has opposed upstream and downstream ends 101a, 101b, respectively, with a carrier gas inlet 102 being positioned at the upstream end 101a and a carrier gas outlet 104 being positioned at the downstream end 101b. After the gallium antimonide is formed, an inert carrier gas (such as argon or nitrogen) is flowed through the aluminum tube furnace 100 from the inlet 102 to the outlet 104, such that the GaSb vapor 110 flows downstream and deposits the thin film of GaSb 16 on an upper surface of the mica substrate 14, as in conventional PVD. Prior to placing the mica substrate 14 in the aluminum tube furnace 100, the mica substrate 14 is preferably washed repeatedly with alcohol and acetone.

For purposes of the experiment described above, high purity (99.999%) gallium ingot (0.421 g) and antimony shot (0.415 g) were placed in a quartz boat mounted in the central zone of the tube furnace 100. The central temperature of the tube furnace 100 was about 850° C. for a duration of 180 minutes. A field emission scanning electron microscope (FE-SEM), operated at an accelerating voltage of 20 kV, was used to characterize the surface morphology of the GaSb thin film 16. Energy-dispersive X-ray spectroscopy (EDX) analysis was carried out with accelerating voltage of 200 kV. X-ray diffraction (XRD) analysis was further performed to reveal the structural quality of the grown films by using an X-ray diffraction instrument equipped with a filter of Cu-Kα, k=1.5406 Å radiation in the reflection mode and using a glancing angle incidence of 1.5°. A Fourier transform infrared (FTIR) spectrometer was used to measure transmission. Additionally, an ultraviolet-visible light (UV-VIS) photospectrometer was used to measure the absorbance, and thus the band gap, of the grown thin films. Conductive graphite paste was used to attach the electrodes, and current-voltage characteristics were determined in both illuminated and dark conditions using a solar light simulator and a source meter.

Figure 3A:
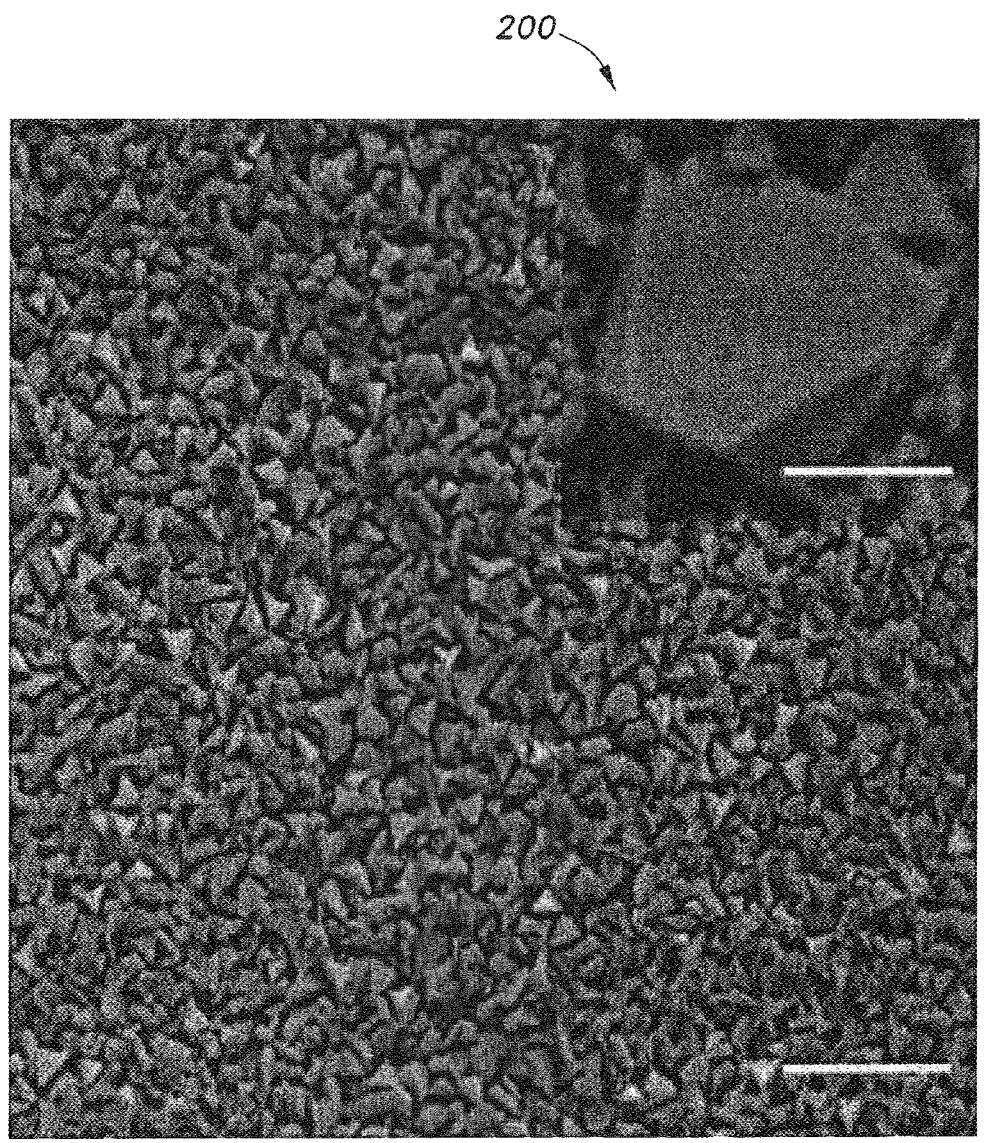
FIG. 3A is a scanning electron microscope (SEM) micrograph of a gallium antimonide thin film grown on a mica substrate at 200° C. using the present method of making a gallium antimonide near infrared photodetector according to the present invention.
Figure 3B:
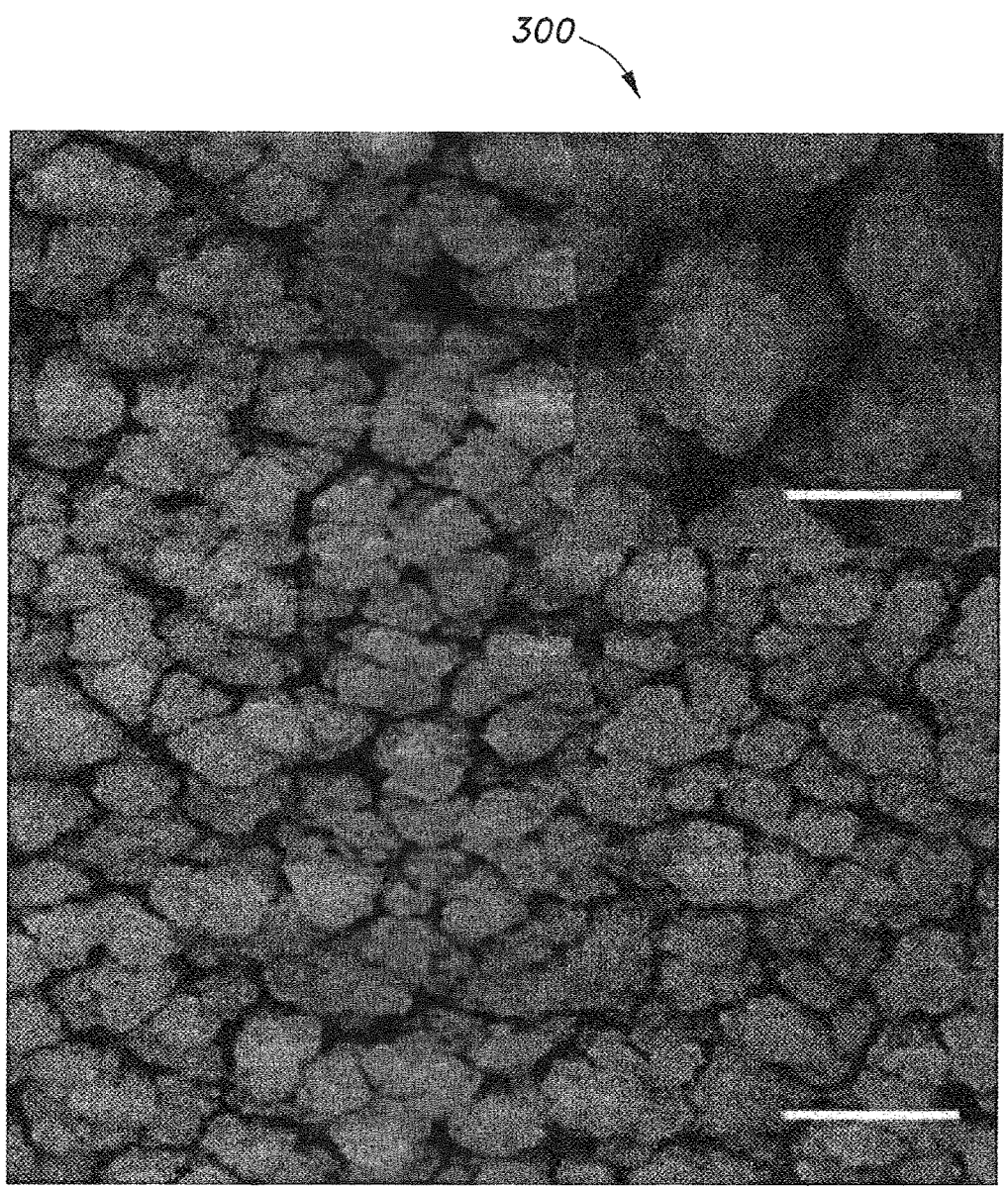
FIG. 3B is a scanning electron microscope (SEM) micrograph of a gallium antimonide thin film grown on a mica substrate at 300° C. using the present method of making a gallium antimonide near infrared photodetector according to the present invention.
Figure 3C:
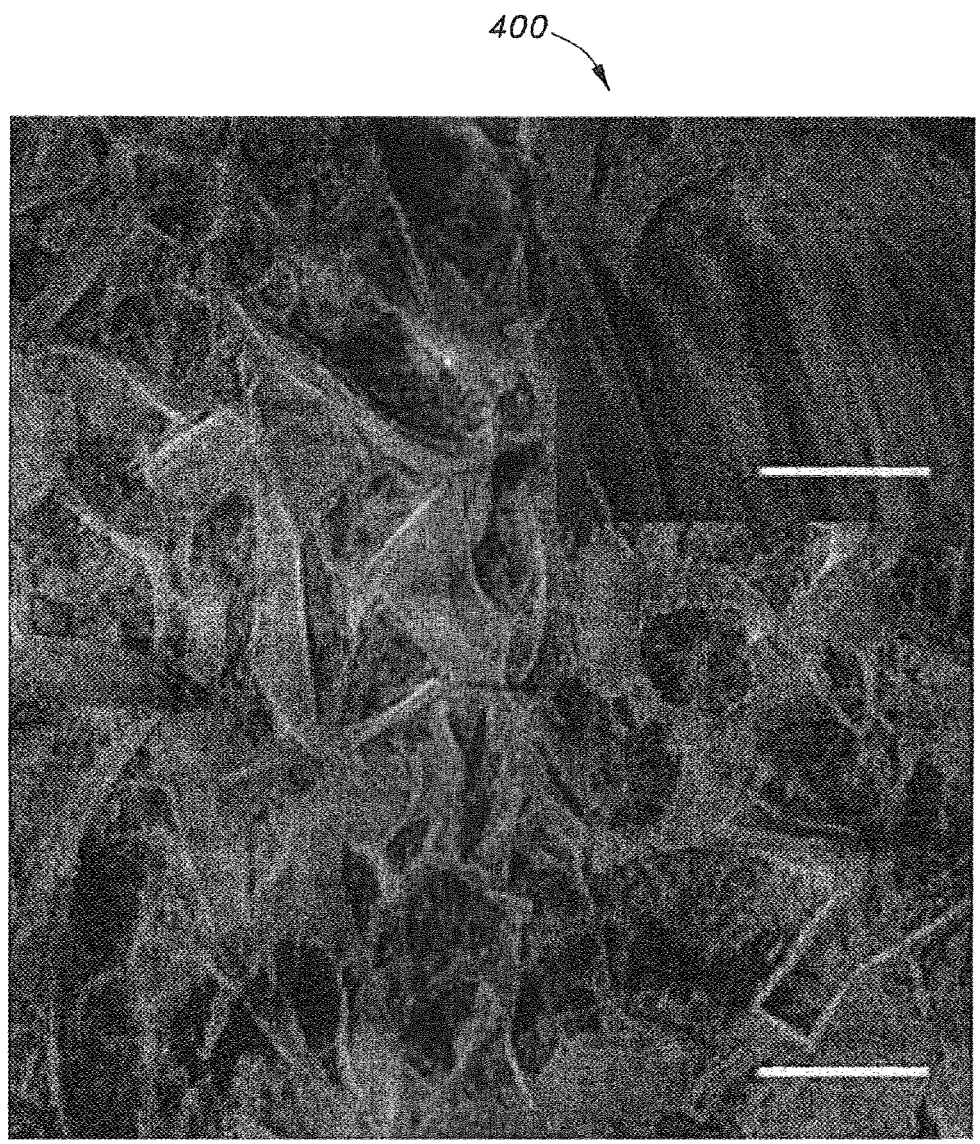
FIG. 3C is a scanning electron microscope (SEM) micrograph of a gallium antimonide thin film grown on a mica substrate at 500° C. using the present method of making a gallium antimonide near infrared photodetector according to the present invention.

FIGS. 3A, 3B and 3C illustrate the surface morphology of the GaSb films 16 grown on the mica substrates 14 at three different deposition zone temperatures. FIG. 3A shows the growth of GaSb at 200° C., which results in micro-size triangular structures, as shown. In FIG. 3A, the scale bar represents 10 μm, and inset 200 is on the scale of 500 nm. FIG. 3B illustrates the morphology of the GaSb thin film grown at 300° C., and small grains (on the order of a nanometer) can be seen, grown with regular symmetries, which evolve to more regular shapes with reduced surface roughness. In FIG. 3B, the scale bar represents 10 μm, and inset 300 is on the scale of 500 nm.

FIG. 3C shows the surface morphology of GaSb thin films grown at about 500° C. As shown in the main image, leaf-like structures with spikes can be seen grown on the mica substrate. In the inset 400, on the more detailed scale of 500 nm, a very smooth surface of GaSb, with no outgrowths, can be seen. The more regular surface morphology of the gallium antimonide film may be attributed to the reduced surface diffusion of atoms, thus resulting in a suppressed three-dimensional growth at low growth temperature. The thermal effects shown in FIGS. 3A-3C indicate that the size of the GaSb nanoparticles decrease as the growth temperature decreases, which ultimately increases the optical band gap.

Figure 4:
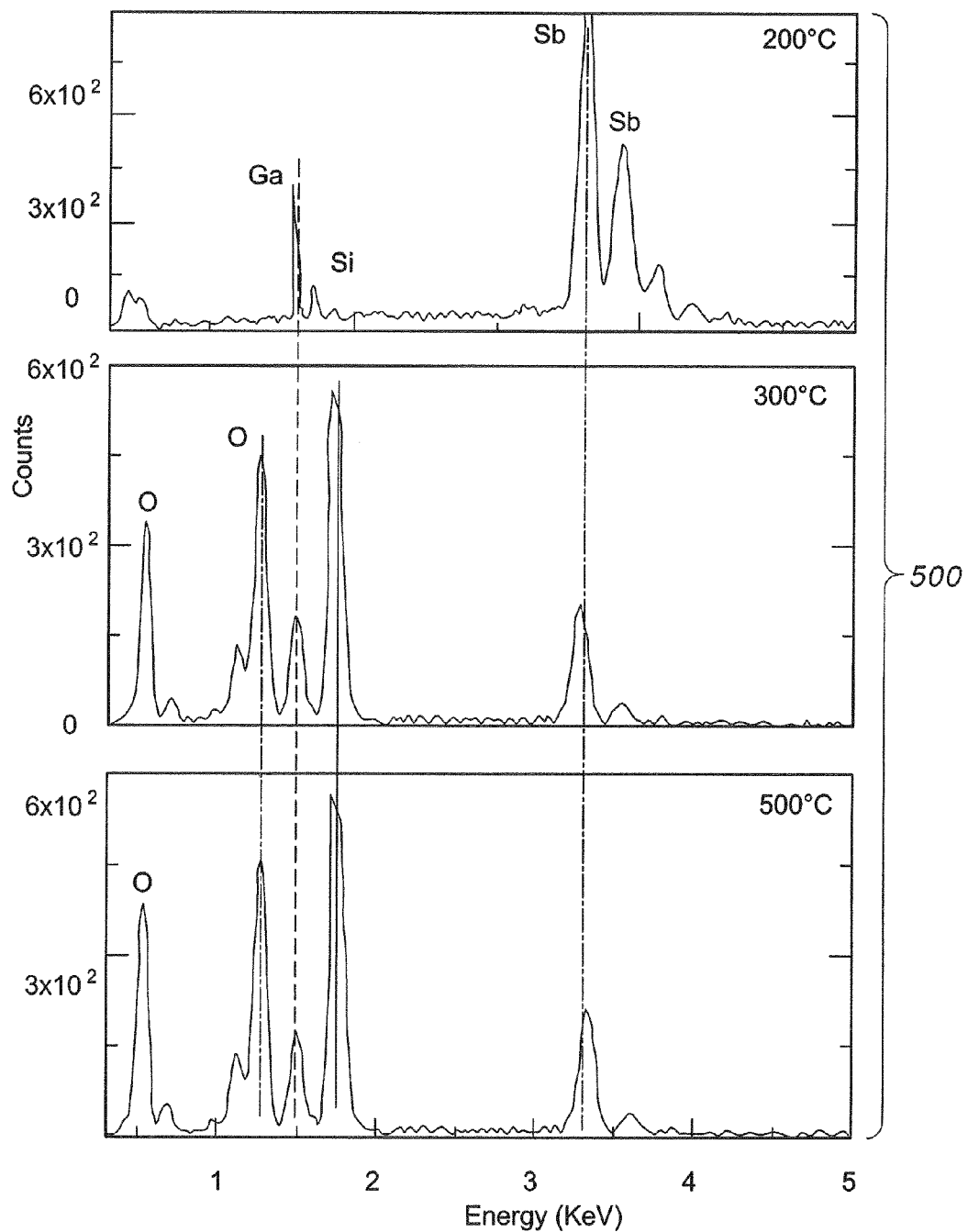
FIG. 4 is a composite showing energy-dispersive X-ray (EDX) spectra of gallium antimonide thin films grown using the present method of making a gallium antimonide near infrared photodetector according to the present invention at deposition zone temperatures of 200° C. (top), 300° C. (middle) and 500° C. (bottom).

The collective plots 500 of FIG. 4 show the results of the elemental analysis performed on the GaSb thin films by EDX, with plot comparisons for thin films grown at 200° C., 300° C., and 500° C. As can be seen in FIG. 4, the sample grown at 500° C. has almost equal quantitative ratios of Ga and Sb contents. The EDX spectra show that the stoichiometric ratios of the grown GaSb films varied significantly, depending on growth temperatures. The incorporated gallium content decreases significantly at lower growth temperatures, while the antimony content increases at low temperatures. For example, the growth temperature of 200° C. resulted in a gallium signal that was significantly reduced. As the temperature increases, the content of both ingredients increase accordingly. At a lower temperature, the growth zone is further away from the source materials, and this deficiency of gallium may be attributed to a low effective vapor pressure compared with the antimony. Additionally, the low temperatures may be insufficient to ensure the reaction of the source materials.

Figure 5:
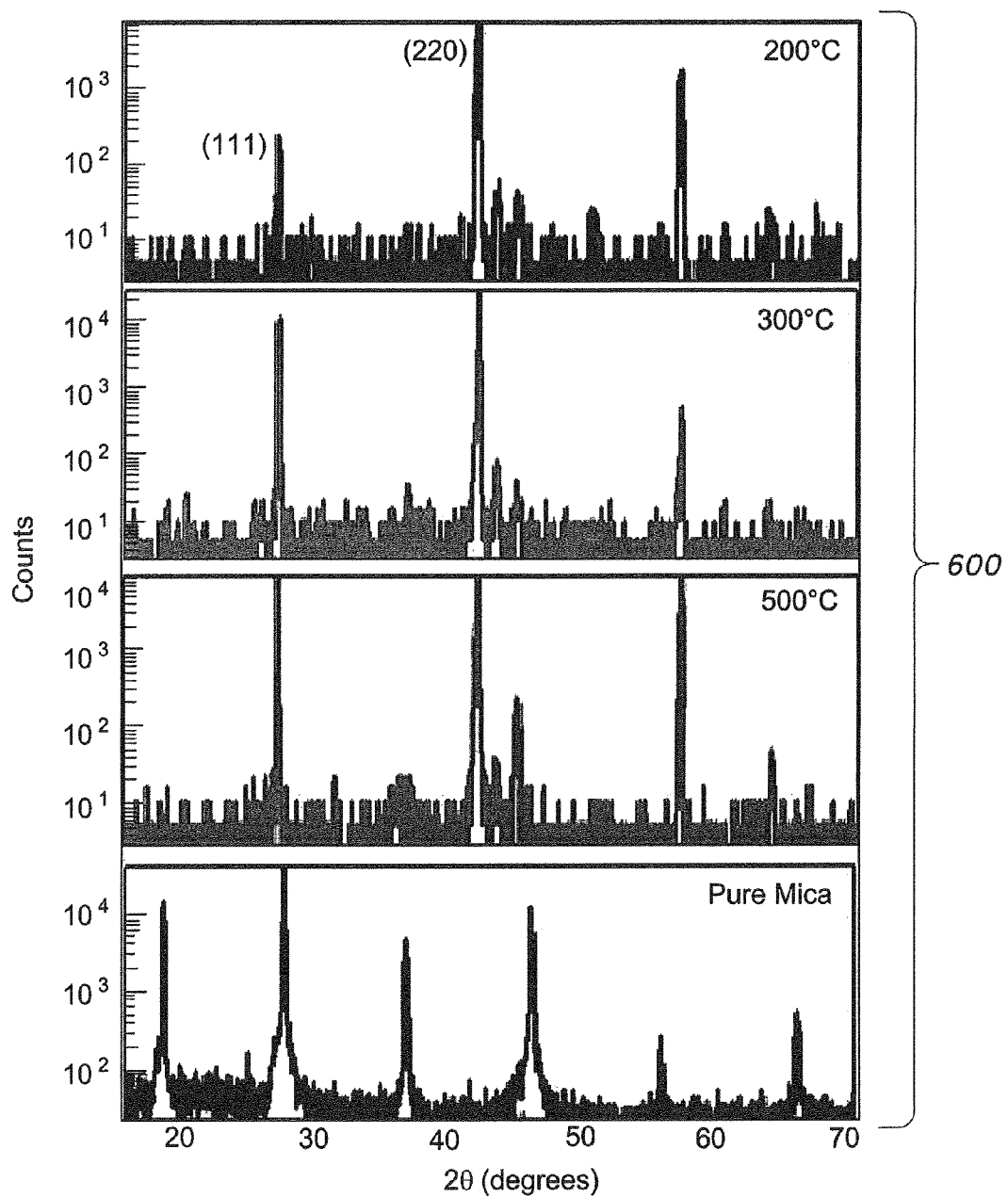
FIG. 5 is a composite showing X-ray diffraction (XRD) spectra of gallium antimonide thin films grown using the present method of making a gallium antimonide near infrared photodetector according to the present invention at deposition zone temperatures of 200° C. (top), 300° C. (second from top), and 500° C. (third from top) compared to pure mica substrate (bottom).

XRD measurement also confirms the formation of gallium antimonide for all samples, as shown in FIG. 5. The collective plots 600 of FIG. 5 show the results of the XRD measurements performed on the GaSb thin films, with plot comparisons for thin films grown at 200° C., 300° C., and 500° C. A prominent peak can be seen at 25.288°, which can be assigned to the GaSb (111) diffraction peak. Another peak at 41.88°, from the GaSb (220) plane, can also been seen, but with a high intensity that corresponds to Powder Diffraction File (PDF) #89-4298, which corresponds to face-centered cubic (FCC) GaSb, and Inorganic Crystal Structure Database (ICSD) #044979, which also corresponds to FCC GaSb. The presence of diffraction peaks from only the (111) and (220) planes may indicate well-oriented microcrystals of the GaSb film grown on the mica substrates.

Figure 6:
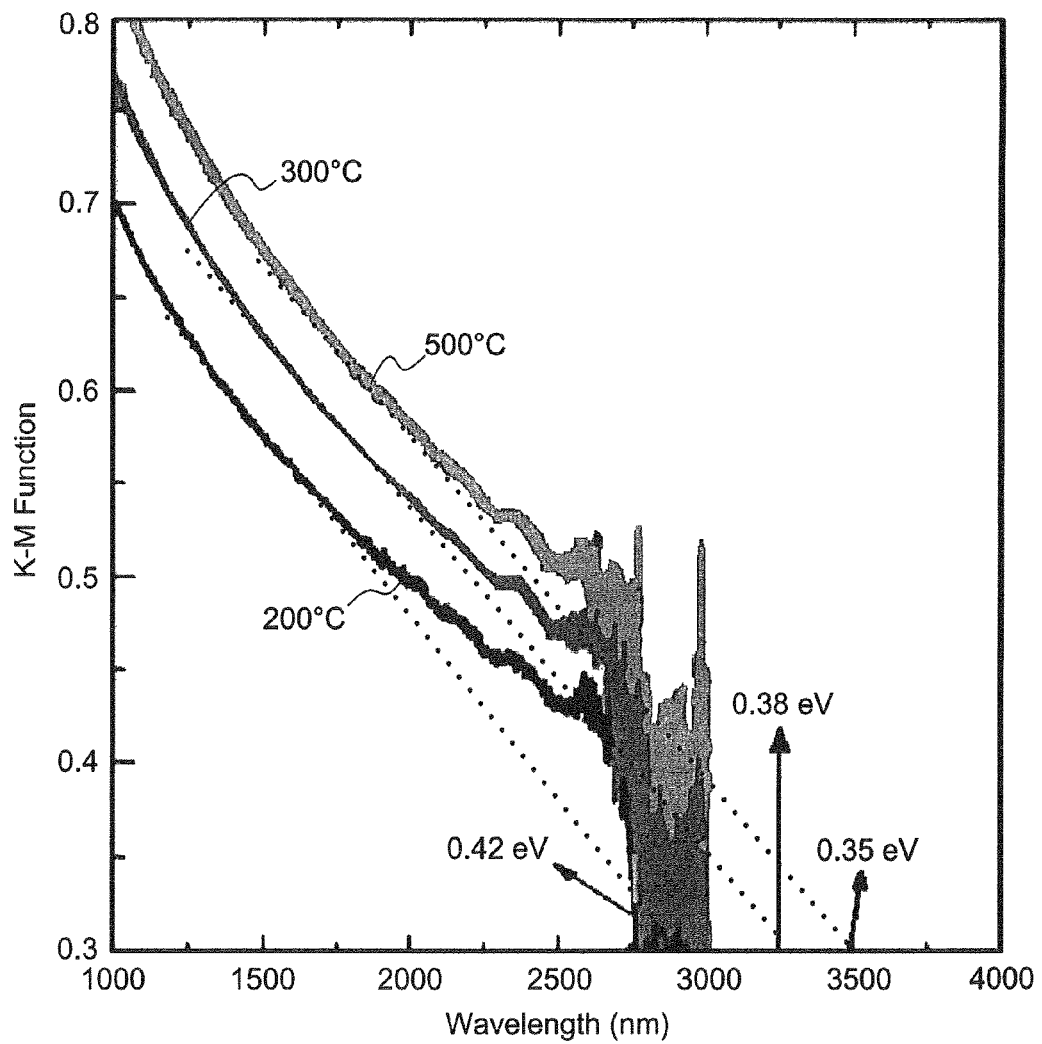
FIG. 6 is a Tauc plot of the Kubelka Monk Function vs. wavelength for gallium antimonide thin films grown using the present method of making a gallium antimonide near infrared photodetector according to the present invention at deposition zone temperatures of 200° C., 300° C., and 500° C.
Figure 7A:
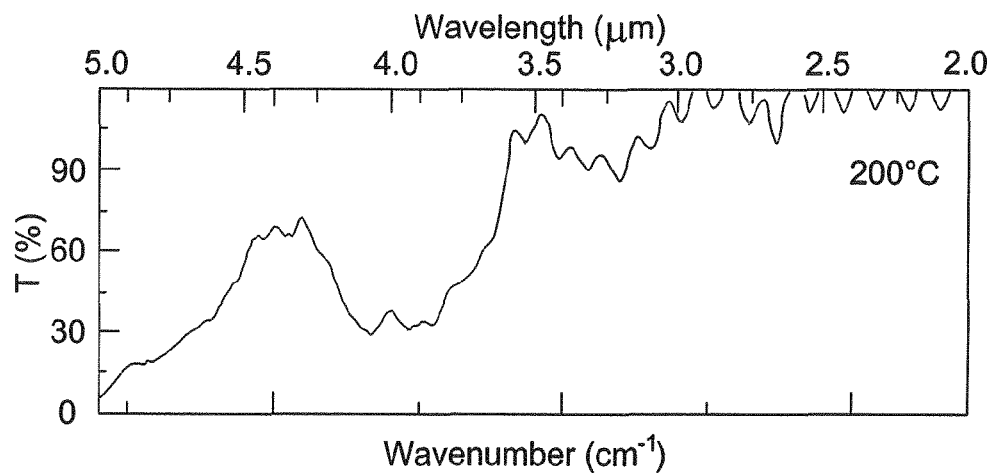
FIG. 7A shows the Fourier transform infrared (FTIR) spectrum of gallium antimonide thin films grown using the present method of making a gallium antimonide near infrared photodetector according to the present invention at a deposition zone temperature of 200° C.
Figure 7B:
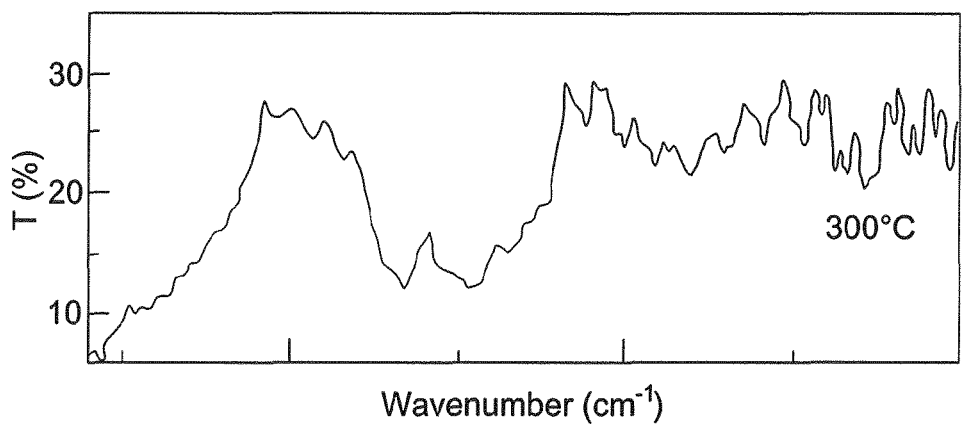
FIG. 7B shows the Fourier transform infrared (FTIR) spectrum of gallium antimonide thin films grown using the present method of making a gallium antimonide near infrared photodetector according to the present invention at a deposition zone temperature of 300° C.
Figure 7C:
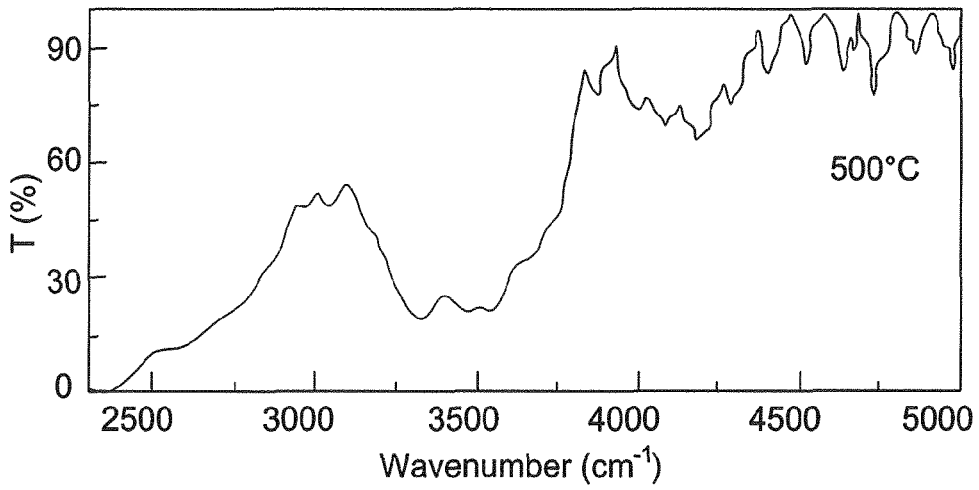
FIG. 7C shows the Fourier transform infrared (FTIR) spectrum of gallium antimonide thin films grown using the present method of making a gallium antimonide near infrared photodetector according to the present invention at a deposition zone temperature of 500° C.

In order to calculate the band gap of the thin films, optical transmission and absorption of the GaSb thin films grown with different deposition temperatures were measured by UV-VIS-NIR (as shown in FIG. 6) and FTIR spectrometry (as shown in FIGS. 7A-7C). The FTIR analysis of the GaSb samples (FIGS. 7A-7C) show distinct absorption in the near-infrared region. The common absorption peaks of the GaSb films at 3000 $cm^{-1}$ and 3750 $cm^{-1}$ do not correspond to absorption, since the mica substrates are fully transparent. The lower transmission of the GaSb films grown at 300° C. may be due to a slightly thicker film being formed. The incorporation of excess antimony in the film may also result in reduced transmission of the film. FIG. 6 shows the absorption measurement and optical band gap by plotting the Kubelka-Monk (K-M) function versus wavelength. This Tauc plot verifies that the 3000 $cm^{-1}$ and 3750 $cm^{-1}$ peaks correspond to band gap energy value of 0.38 eV and 0.45 eV, respectively. These results strongly demonstrate that the growth temperature significantly affects the band gap of the GaSb. The absorption peaks exhibit red shifts with increasing temperature, resulting in a significant change in band gap energy.

Figure 8A:
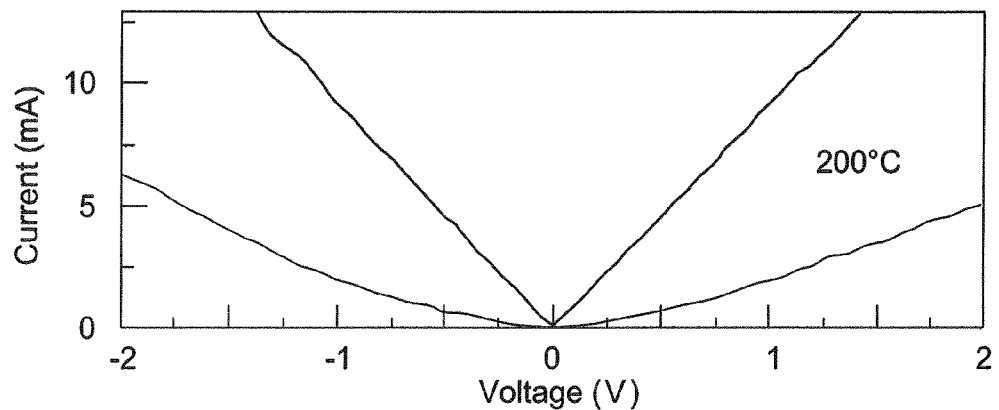
FIG. 8A is a current density-voltage (J-V) plot for a gallium antimonide near infrared photodetector made by the present method of making a gallium antimonide near infrared photodetector according to the present invention at a deposition zone temperature of 200° C.
Figure 8B:
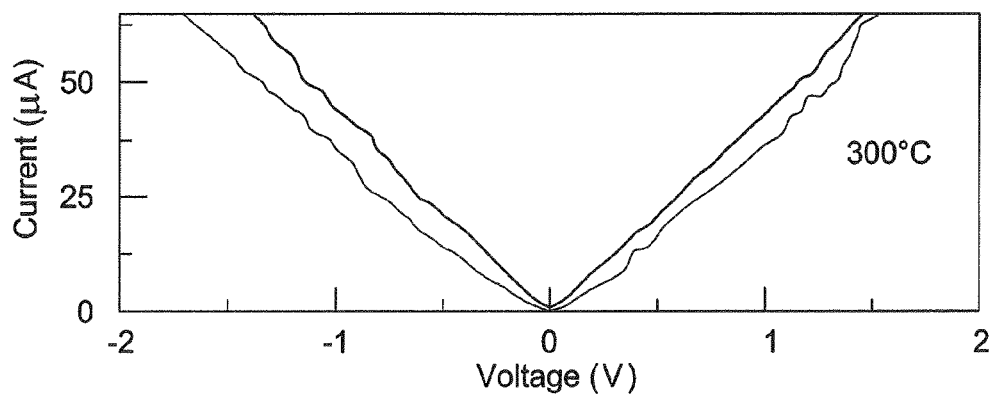
FIG. 8B is a current density-voltage (J-V) plot for a gallium antimonide near infrared photodetector made by the present method of making a gallium antimonide near infrared photodetector according to the present invention at a deposition zone temperature of 300° C.
Figure 8C:
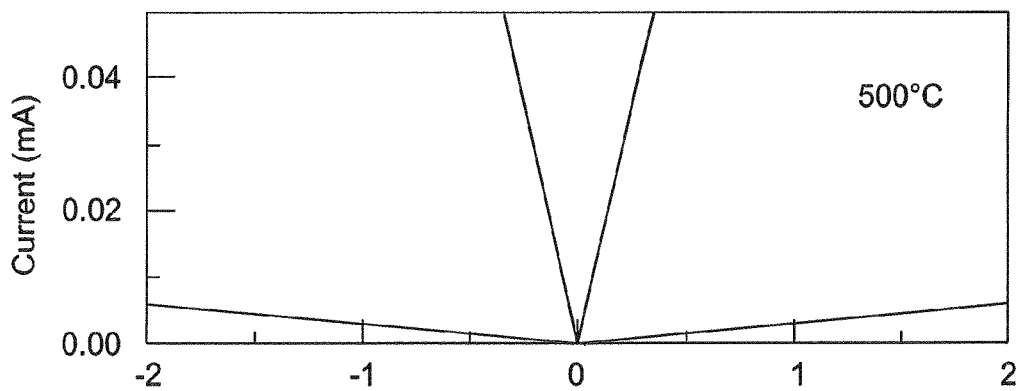
FIG. 8C is a current density-voltage (J-V) plot for a gallium antimonide near infrared photodetector made by the present method of making a gallium antimonide near infrared photodetector according to the present invention at a deposition zone temperature of 500° C.

Three photodetectors 10, similar to that shown in FIG. 1, were made using the present method at the deposition zone temperatures of 200° C., 300° C., and 500° C. Current density-voltage (J-V) characteristics of the three photodetectors were measured at 300 K. FIGS. 8A, 8B and 8C show the J-V characteristics measured for the photodetectors under both illumination and dark conditions, for photodetectors made at the deposition zone temperatures of 200° C., 300° C., and 500° C., respectively. As shown, each current curve shows a linear dependence of the bias voltage, which indicates formation of good ohmic contacts. It is interesting to note that the GaSb films grown at lower temperatures with improved surface smoothness show relatively lower dark currents and high photocurrents. On the other hand, despite the leaf-like surface textures, the photodetectors fabricated from the GaSb film grown at 500° C. show the best photoresponse.

Upon illumination, a distinct enhancement in photocurrent was observed, which indicates good photoresponse for the GaSb thin film grown at 500° C. The improved performance of the device based on GaSb films grown at high temperatures is attributed to the high crystalline quality of the film, although the deficiency of Sb measured from EDX will lead to poor performance of the photodetector devices. The excess antimony incorporated in the film can contribute to a high dark current, thus overwhelming the photocurrent.

Figure 9A:
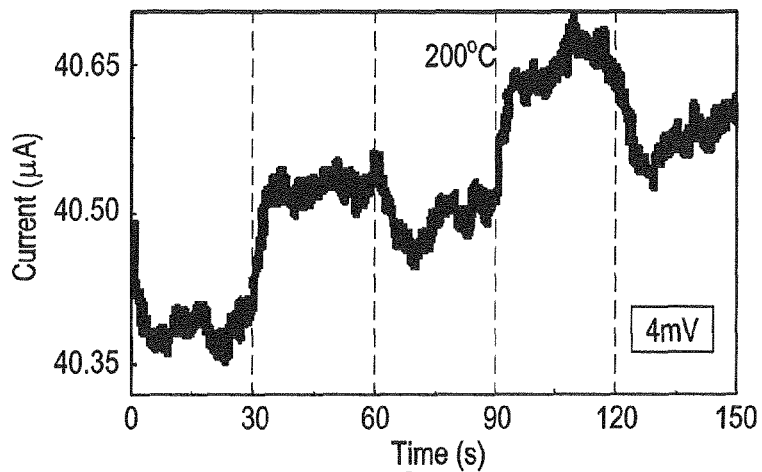
FIGS. 9A, 9B, and 9C are graphs showing transient photoresponse produced by a GaSb-based near infrared photodetector manufactured by the present method of making a gallium antimonide near infrared photodetector according to the present invention at a deposition zone temperature of 200° C. at a bias voltage of 4 mV, 40 mV, and 400 mV, respectively.
Figure 9B:
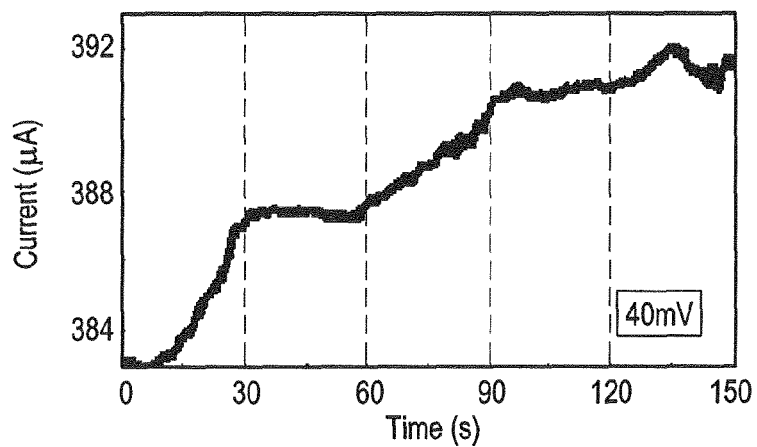
Figure 9C:
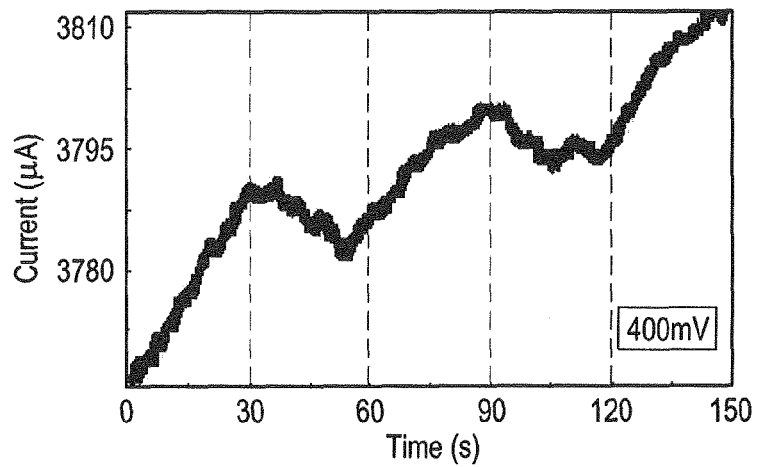
Figure 10A:
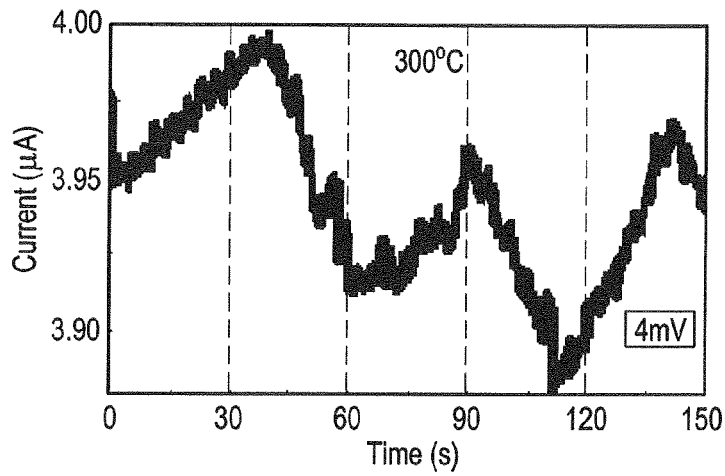
FIGS. 10A, 10B, and 10C are graphs showing transient photoresponse produced by a GaSb-based near infrared photodetector manufactured by the present method of making a gallium antimonide near infrared photodetector according to the present invention at a deposition zone temperature of 300° C. at a bias voltage of 4 mV, 40 mV, and 400 mV, respectively.
Figure 10B:
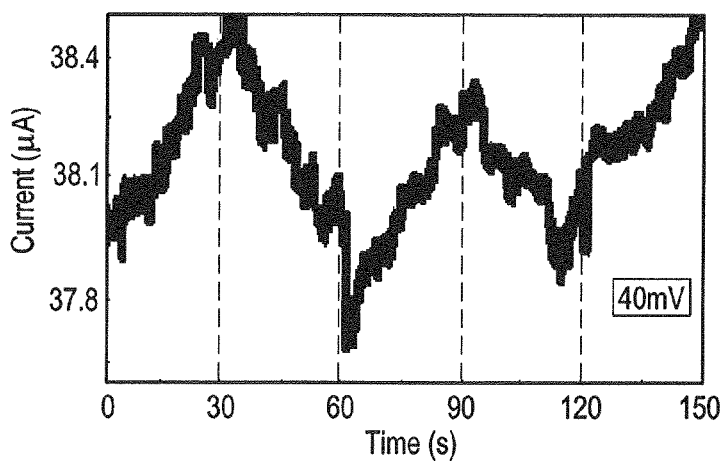
Figure 10C:
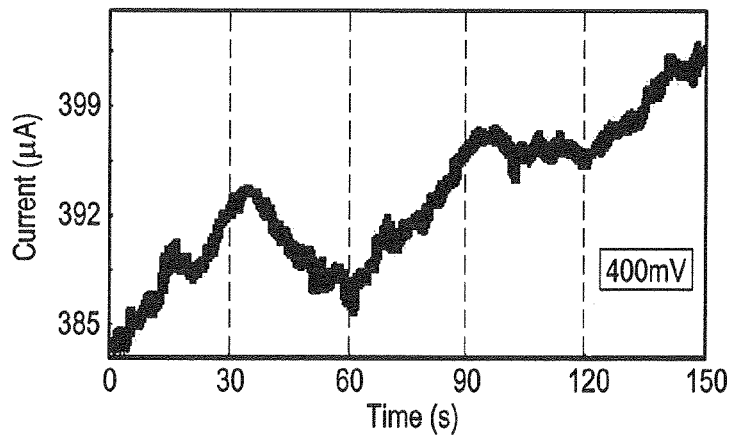
Figure 11A:
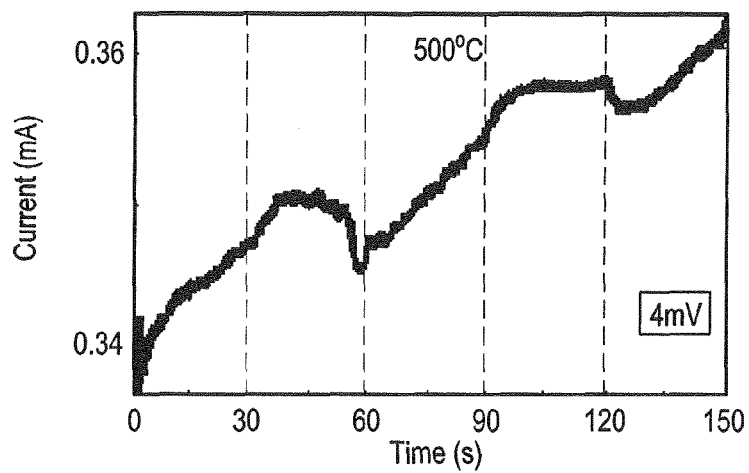
FIGS. 11A, 11B, and 11C are graphs showing transient photoresponse produced by a GaSb-based near infrared photodetector manufactured by the present method of making a gallium antimonide near infrared photodetector according to the present invention at a deposition zone temperature of 500° C. at a bias voltage of 4 mV, 40 mV, and 400 mV, respectively.
Figure 11B:
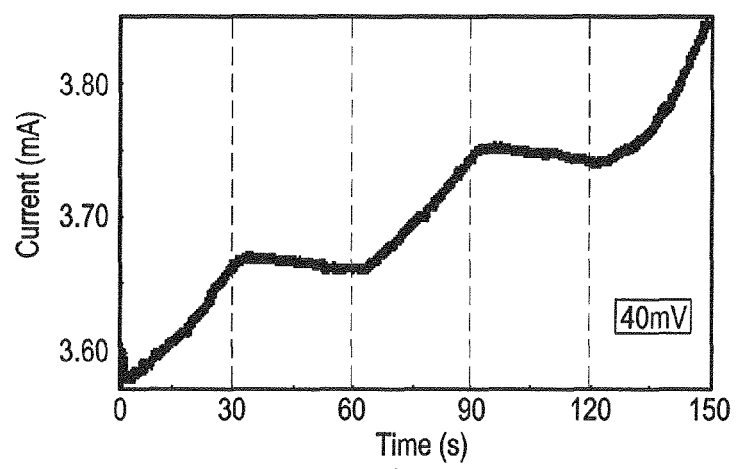
Figure 11C:
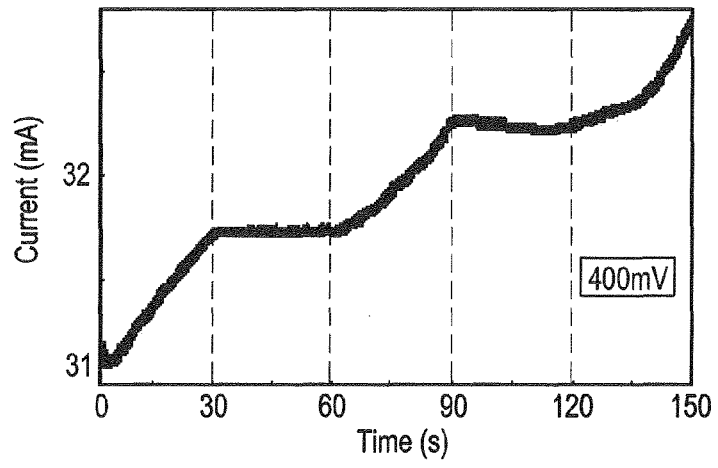

The time-dependent photo responses of the GaSb thin films are shown in FIGS. 9A, 9B and 9C for thin films grown at 200° C., in FIGS. 10A, 10B, and 10C for thin films grown at 300° C., and in FIGS. 11A, 11B, and 11C for thin films grown at 500° C., respectively. In FIGS. 9A-9C, for thin films grown at 200° C., the plots show responses at bias voltages of 4 mV, 40 mV, and 400 mV, respectively. In FIGS. 10A-10C, for thin films grown at 300° C., the plots show responses at bias voltages of 4 mV, 40 mV, and 400 mV, respectively. In FIGS. 11A-11C, for thin films grown at 500° C., the plot plots show responses at bias voltages of 4 mV, 40 mV and 400 mV. All samples demonstrated a noticeable photo response while switching illumination on and off. However, the on/off ratio remains slow, primarily due to the high dark current. The high dark current may result from a large density of surface states, which makes the film more conductive.

At zero bias voltage, no on/off switching was observed because of the photoconductive nature of the device. With increasing bias voltage, the on/off ratio was clearly improved with better transient time of photo-generated carriers. Further, the photoresponse dynamics of all devices showed poor response time. The relatively long rise and decay time of the current may be attributed to the trap states in the GaSb film. The presence of surface states results in trapping/detrapping of photoexcited carriers, and thus a slow rise and decay time. For example, the oxygen-related holes trap states at the GaSb surface can cause a slow photo response. It should be noted that the detectors fabricated from low temperature grown GaSb films show inferior signal-to-noise ratios, which is in good agreement with the EDX and J-V measurements. It is expected that the rise and decay time, the on/off ratio, and the dark current can each be improved via passivation of the surface states.

It is to be understood that the present invention is not limited to the embodiments described above, but encompasses any and all embodiments within the scope of the following claims.

We claim:

1. A method of making a gallium antimonide (GaSb) near infrared photodetector, comprising the steps of:
    forming a film of GaSb on a mica substrate using physical vapor deposition, wherein the physical vapor deposition further comprises the steps of:
        i) placing high purity gallium and high purity antimony in a central zone of an elongated tube furnace, the furnace having an upstream end and a downstream end;
        ii) placing mica substrate in the downstream end of the furnace;
        iii) heating the central zone to form gallium antimonide until the gallium antimonide forms a vapor, the furnace having a temperature gradient extending from the central zone to the downstream end; and
        iv) introducing a flow of an inert carrier gas into the furnace from the upstream end to the downstream end, whereby a thin film of gallium antimonide is deposited on the mica substrate; and
    attaching a pair of spaced apart electrodes on the film of GaSb.

2. The method of making a gallium antimonide near infrared photodetector as recited in claim 1, wherein the step of placing the gallium and the antimony further comprises placing the gallium and the antimony in a quartz boat.

3. The method of making a gallium antimonide near infrared photodetector as recited in claim 1, wherein the step of placing the gallium and the antimony further comprises placing substantially equal masses of gallium and antimony in the central zone.

4. The method of making a gallium antimonide near infrared photodetector as recited in claim 1, wherein the furnace comprises an aluminum tube furnace.

5. The method of making a gallium antimonide near infrared photodetector as recited in claim 1, wherein said step of heating the central zone further comprises heating the central zone to about 850° C.

6. The method of making a gallium antimonide near infrared photodetector as recited in claim 1, further comprising the step of measuring temperature in the furnace where said mica substrate is placed with a thermocouple.

7. The method of making a gallium antimonide near infrared photodetector according to claim 6, wherein the measured temperature where said mica substrate is placed is about 500° C. when the thin film of gallium antimonide is deposited on the mica substrate.

8. A gallium antimonide near infrared photodetector made according to claim 7.

9. The method of making a gallium antimonide near infrared photodetector according to claim 6, wherein the measured temperature where said mica substrate is placed is between 200° C. and 500° C. when the thin film of gallium antimonide is deposited on the mica substrate.

10. The method of making a gallium antimonide near infrared photodetector as recited in claim 1, further comprising the step of washing the mica substrate prior to the step of placing the mica substrate in the furnace.

11. The method of making a gallium antimonide near infrared photodetector as recited in claim 10, wherein the step of washing the mica substrate comprises washing the mica substrate with alcohol and acetone.

\* \* \* \* \*